(12) United States Patent
Hatem et al.

(10) Patent No.: US 11,862,433 B2
(45) Date of Patent: Jan. 2, 2024

(54) SYSTEM AND METHODS USING AN INLINE SURFACE ENGINEERING SOURCE

(71) Applicant: Varian Semiconductor Equipment Associates, Inc., Gloucester, MA (US)

(72) Inventors: Christopher Hatem, Seabrook, NH (US); Peter F. Kurunczi, Cambridge, MA (US); Christopher A. Rowland, Rockport, MA (US); Joseph C. Olson, Beverly, MA (US); Anthony Renau, West Newbury, MA (US)

(73) Assignee: Varlan Semiconductor Equipment Associates, Inc., Gloucester, MA (US)

( * ) Notice: Subject to any disclaimer, the term of this patent is extended or adjusted under 35 U.S.C. 154(b) by 73 days.

(21) Appl. No.: 17/347,048

(22) Filed: Jun. 14, 2021

(65) Prior Publication Data
US 2021/0313154 A1    Oct. 7, 2021

Related U.S. Application Data

(62) Division of application No. 16/015,323, filed on Jun. 22, 2018, now Pat. No. 11,069,511.

(51) Int. Cl.
*H01L 21/67* (2006.01)
*H01J 37/32* (2006.01)
*H01J 37/36* (2006.01)

(52) U.S. Cl.
CPC .. *H01J 37/32422* (2013.01); *H01J 37/32357* (2013.01); *H01J 37/36* (2013.01);
(Continued)

(58) Field of Classification Search
CPC ........... H01J 2237/332; H01J 2237/334; H01J 2237/335; H01J 37/32357;
(Continued)

(56) References Cited

U.S. PATENT DOCUMENTS 6,452,198 B1   9/2002  Mani et al.
6,716,727 B2   4/2004  Walther
(Continued)

FOREIGN PATENT DOCUMENTS

JP   2000-331935 A    11/2000
JP   2010-171372 A     8/2010
(Continued)

OTHER PUBLICATIONS

International Search Report and Written Opinion dated Oct. 8, 2019 in corresponding PCT application No. PCT/US2019/036667.

*Primary Examiner* — Matthew C Landau
*Assistant Examiner* — Dmitriy Yemelyanov
(74) *Attorney, Agent, or Firm* — NIELDS, LEMACK & FRAME, LLC

(57) ABSTRACT

A system having an auxiliary plasma source, disposed proximate the workpiece, for use with an ion beam is disclosed. The auxiliary plasma source is used to create ions and radicals which drift toward the workpiece and may form a film. The ion beam is then used to provide energy so that the ions and radicals can process the workpiece. Further, various applications of the system are also disclosed. For example, the system can be used for various processes including deposition, implantation, etching, pre-treatment and post-treatment. By locating an auxiliary plasma source close to the workpiece, processes that were previously not possible may be performed. Further, two dissimilar processes, such as cleaning and implanting or implanting and passivating can be performed without removing the workpiece from the end station.

7 Claims, 9 Drawing Sheets

(52) U.S. Cl.
CPC .. *H01L 21/67028* (2013.01); *H01L 21/67069* (2013.01); *H01J 2237/332* (2013.01); *H01J 2237/334* (2013.01); *H01J 2237/335* (2013.01)

(58) Field of Classification Search
CPC ............... H01J 37/32422; H01J 37/36; H01L 21/67028; H01L 21/67069
See application file for complete search history.

(56) References Cited

U.S. PATENT DOCUMENTS

| | | |
|---|---|---|
| 11,069,511 B2 | 7/2021 | Hatem et al. |
| 2007/0221870 A1 | 9/2007 | Olson et al. |
| 2009/0084757 A1* | 4/2009 | Erokhin .............. H01J 37/3053 204/298.36 |
| 2010/0019141 A1* | 1/2010 | Olson ................... H01J 37/304 250/397 |
| 2010/0163525 A1 | 7/2010 | Lee et al. |
| 2010/0264328 A1 | 10/2010 | Biloiu et al. |
| 2012/0202341 A1 | 8/2012 | Lu et al. |
| 2015/0041423 A1 | 2/2015 | Schmertz et al. |
| 2016/0056020 A1 | 2/2016 | Ekobou et al. |
| 2016/0071734 A1 | 3/2016 | Graf et al. |
| 2017/0178894 A1 | 6/2017 | Stone et al. |
| 2019/0122860 A1 | 4/2019 | Lee et al. |
| 2019/0393019 A1 | 12/2019 | Hatem et al. |

FOREIGN PATENT DOCUMENTS

| | | | |
|---|---|---|---|
| KR | 10-0382720 B1 | 5/2003 | |
| WO | WO-9959384 A1 * | 11/1999 | ............. C23C 16/26 |

* cited by examiner

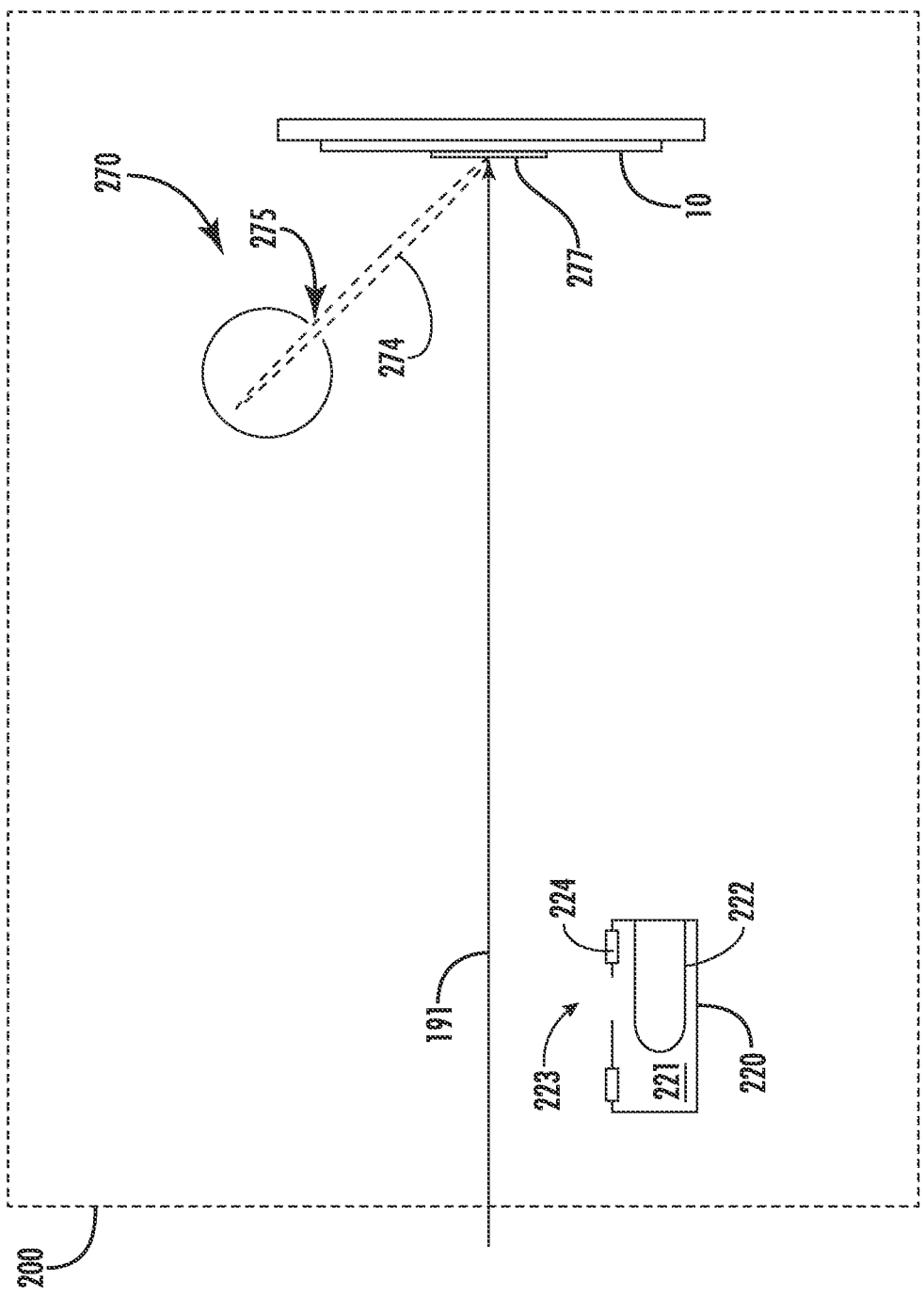

SYSTEM AND METHODS USING AN INLINE SURFACE ENGINEERING SOURCE

This application is a divisional of U.S. patent application Ser. No. 16/015,323 filed Jun. 22, 2018, the disclosure of which is incorporated herein by reference in its entirety.

FIELD

Embodiments of the present disclosure relate to semiconductor processing systems and methods using an inline surface engineering source, and more particularly, the use of a source of ions and radicals proximate a workpiece for use in conjunction with an ion beam.

BACKGROUND

The fabrication of a semiconductor device involves a plurality of discrete and complex processes. One such process may be an implant process, where a dopant material is implanted into a workpiece. Another process may be a deposition process, wherein material is deposited on the workpiece. Yet another process may be an etch process where material is removed from the workpiece.

To direct the ions along the desired path, a beam line system with a plurality of components, such as electrodes, mass analyzers, quadrupole lenses, and acceleration/deceleration stages, is used. Much like an optics system, the beam line system manipulates the ions by bending the path of the ions and focusing the ions.

In some embodiments, a ribbon ion beam is created. A ribbon ion beam is an ion beam that is much wider than it is tall. Stated differently, the aspect ratio of the ribbon ion beam, which is defined as its width divided by its height, as measured at the workpiece, may be very high, such as greater than 20. In some embodiments, the width of the ribbon beam is wider than the diameter of the workpiece that is being processed.

Over the years, ion implanters have become highly sophisticated tools incorporating the use of energy filters, collimators, scanning systems and more recently, molecular ion sources, cryogenic and elevated implant temperature capabilities. As memory and logic architectures continue to scale and complex structures such as Gate-all-around become possible, there is an increasing desire to control and modify near surface processes in line with ion implantation. These near surface processes may include native oxide clean, surface passivation, new damage engineering techniques to reduce defectivity, graded profiles from the surface to the typical retrograde profiles traditional of beamline, and selective processing where the ion beam itself is the catalyst to a reaction on the surface.

Therefore, it would be beneficial if there was a semiconductor processing system and method for creating an inline surface engineering source proximate a workpiece so as to perform near surface processes on the workpiece in conjunction with an ion beam.

SUMMARY

A system having an auxiliary plasma source, disposed proximate the workpiece, for use with an ion beam is disclosed. The auxiliary plasma source is used to create ions and radicals which drift toward the workpiece and may form a film. The ion beam is then used to provide energy so that the ions and radicals can process the workpiece. Further, various applications of the system are also disclosed. For example, the system can be used for various processes including deposition, implantation, etching, pre-treatment and post-treatment. By locating an auxiliary plasma source close to the workpiece, processes that were previously not possible may be performed. Further, two dissimilar processes, such as cleaning and implanting or implanting and passivating can be performed without removing the workpiece from the end station.

According to one embodiment, a semiconductor processing system is disclosed. The semiconductor processing system comprises an ion source to create an ion beam; and an auxiliary plasma source disposed proximate the workpiece, the auxiliary plasma source having an exit aperture oriented so as to emit ions and radicals toward the workpiece. In some embodiments, the ion source is a component of a beam line implantation system. In certain embodiments, auxiliary plasma source comprises an outer housing, an antenna disposed within the outer housing and a RF power supply in communication with the antenna. In other embodiments, the auxiliary plasma source comprises an outer housing, an antenna disposed outside the outer housing and proximate a wall of the outer housing, and a RF power supply in communication with the antenna. In certain embodiments, the exit aperture is oriented such that the radicals and ions are directed toward the workpiece at a location where the ion beam impacts the workpiece. In other embodiments, the exit aperture is oriented such that the radicals and ions are directed toward the workpiece in a direction parallel to the ion beam. In certain embodiments, the auxiliary plasma source is biased such that the ions are attracted to the workpiece. In some embodiments, the system comprises an end station in which the workpiece is disposed, wherein the auxiliary plasma source is disposed in the end station. In some embodiments, a heater is disposed in the end station. In certain embodiments, a plasma flood gun, separate from the auxiliary plasma source, is disposed in the end station.

According to another embodiment, a method of implanting ions of a desired species into a workpiece is disclosed. The method comprises creating a plasma within an auxiliary plasma source using a gas comprising the desired species, wherein the auxiliary plasma source is located proximate the workpiece, and wherein ions and radicals from the plasma exit the auxiliary plasma source and travel toward the workpiece; and knocking the ions and radicals from the auxiliary plasma source into the workpiece, using an ion beam created using an ion source, different from the auxiliary plasma source. In some embodiments, the ion beam comprises an inert species. In certain embodiments, the ions and radicals from the plasma are directed toward the workpiece at a location where the ion beam impacts the workpiece. In some embodiments, the ions and radicals form a film on a surface of the workpiece at the location where the ion beam impacts the workpiece. In certain embodiments, the desired species comprises a molecule containing a Group III, Group IV or Group V element.

According to another embodiment, a method of processing a workpiece is disclosed. The method comprises creating a plasma within an auxiliary plasma source using a gas comprising an etching species, wherein the auxiliary plasma source is located proximate the workpiece in an end station, wherein ions and radicals from the plasma exit the auxiliary plasma source and react with a native oxide layer on a surface of the workpiece; heating the workpiece after the reacting, wherein heat causes sublimation of the native oxide layer on the workpiece; and performing an additional process on the workpiece using an ion beam created using an ion source, different from the auxiliary plasma source, wherein the workpiece remains in the end station. In certain embodiments, the etching species is selected from the group consisting of ammonia and $NF_3$. In some embodiments, the workpiece is scanned such that a portion of the workpiece is exposed to the plasma and is then subsequently exposed to heat. In some embodiments, the creating and heating are repeated until the surface of the workpiece is cleaned.

According to another embodiment, a method of etching a workpiece is disclosed. The method comprises creating a plasma within an auxiliary plasma source using a gas comprising an etching species, wherein the auxiliary plasma source is located proximate the workpiece, and wherein ions and radicals from the plasma exit the auxiliary plasma source toward a portion of the workpiece and form a film on the portion of the workpiece; and using an ion beam created using an ion source, different from the auxiliary plasma source, to provide energy to etch the workpiece. In certain embodiments, the etching species comprises a halogen. In some embodiments, the etching species comprises $CF_4$ and oxygen. In certain embodiments, the etching species comprises hydrogen and a native oxide layer is etched. In some embodiments, the ion beam comprises an inert gas. In certain embodiments, the ion beam is directed to the portion of the workpiece while the film is being created. In certain embodiments, the ion beam is directed to the portion of the workpiece after the film has been created.

According to another embodiments, a method of depositing material on a workpiece is disclosed. The method comprises creating a plasma within an auxiliary plasma source using a process gas, wherein the auxiliary plasma source is located proximate the workpiece, and wherein ions and radicals from the plasma exit the auxiliary plasma source toward a portion of the workpiece and form a film on the portion of the workpiece; and using an ion beam created using an ion source, different from the auxiliary plasma source, to provide energy to deposit the material on the workpiece. In certain embodiments, the process gas comprises $CH_4$ and the ion beam comprises a Group IV element. In some embodiments, a more box-like profile is created than would be created using only the ion beam.

According to another embodiment, a method of processing a workpiece is disclosed. The method comprises directing ions toward a workpiece using an ion beam; creating a plasma within the auxiliary plasma source using a process gas, wherein the auxiliary plasma source is located proximate the workpiece in an end station, wherein ions and radicals from the plasma exit the auxiliary plasma source and react with a surface of the workpiece; and heating the workpiece after the reacting, wherein heat repairs damage caused by the ion beam on the surface of the workpiece. In certain embodiments, the ion beam is used to implant ions into the workpiece. In certain embodiments, the workpiece is scanned such that a portion of the workpiece is exposed to the plasma and is then subsequently exposed to heat. In some embodiments, the workpiece is heated to a temperature between 1000 and 500° C. In certain embodiments, the process gas comprises a hydrogen/nitrogen mixture. In some embodiments, an entirety of the workpiece is processed by the ion beam prior to the creating and heating. In certain embodiments, a portion of the workpiece is processed by the ion beam and simultaneously a second portion is reacted with the plasma.

BRIEF DESCRIPTION OF THE FIGURES

For a better understanding of the present disclosure, reference is made to the accompanying drawings, which are incorporated herein by reference and in which:

FIG. 5 shows ion implantation using the end station of FIG. 4A;

DETAILED DESCRIPTION

Figure 1:
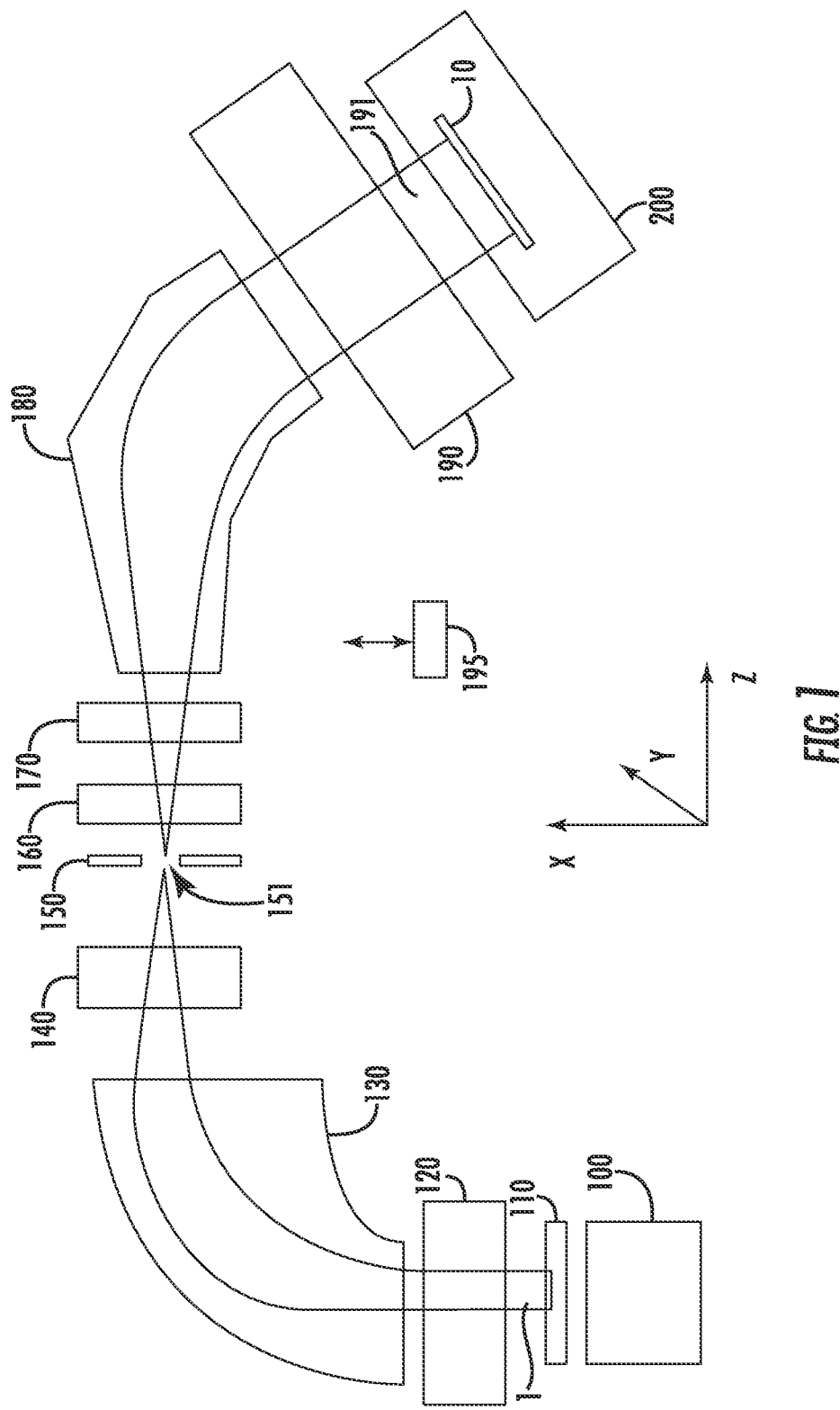
FIG. 1 is a representative view of the beam-line implantation system for creating a ribbon ion beam that may be used with the inline surface engineering source according to one embodiment.

FIG. 1 shows a beam line ion implantation system that may be used with the inline surface engineering source according to one embodiment. The beam line ion implantation system may be used for processing a workpiece using a ribbon ion beam.

The beam line ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The workpiece 10 may be a silicon wafer, or may be another wafer suitable for semiconductor manufacturing, such as GaAs, GaN or GaP. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics are aligned such that the ions 1 pass through both apertures.

Located downstream from the extraction optics 110 may be a first quadrupole lens 120. The first quadrupole lens 120 cooperates with other quadrupole lenses in the system to focus the ions 1 into an ion beam.

Located downstream from the first quadrupole lens 120 is a mass analyzer 130. The mass analyzer 130 uses magnetic fields to guide the path of the extracted ions 1. The magnetic fields affect the flight path of ions according to their mass and charge. A mass resolving device 150 that has a resolving aperture 151 is disposed at the output, or distal end, of the mass analyzer 130. By proper selection of the magnetic fields, only those ions 1 that have a selected mass and charge will be directed through the resolving aperture 151. Other ions will strike the mass resolving device 150 or a wall of the mass analyzer 130 and will not travel any further in the system.

A second quadrupole lens 140 may be disposed between the output of the mass analyzer 130 and the mass resolving device 150.

A collimator 180 is disposed downstream from the mass resolving device 150. The collimator 180 accepts the ions 1 that pass through the resolving aperture 151 and creates a ribbon ion beam formed of a plurality of parallel or nearly parallel beamlets. The output, or distal end, of the mass analyzer 130 and the input, or proximal end, of the collimator 180 may be a fixed distance apart. The mass resolving device 150 is disposed in the space between these two components.

A third quadrupole lens 160 may be disposed between the mass resolving device 150 and the input of the collimator 180. A fourth quadrupole lens 170 may also be disposed between the mass resolving device 150 and the input of the collimator 180.

In certain embodiments, the quadrupole lenses may be disposed in other positions. For example, the third quadrupole lens 160 may be disposed between the second quadrupole lens 140 and the mass resolving device 150. Additionally, one or more of the quadrupole lens may be omitted in certain embodiments.

Located downstream from the collimator 180 may be an acceleration/deceleration stage 190. The acceleration/deceleration stage 190 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF).

The ions 1 exit the acceleration/deceleration stage 190 as an ion beam 191 and enter the end station 200. The ion beam 191 may be a ribbon ion beam. The workpiece 10 is disposed in the end station 200.

Thus, the beam line ion implantation system comprises a plurality of components, terminating in an end station 200. As described above, these components include the ion source 100; the extraction optics 110; the quadrupole lenses 120, 140, 160, 170; the mass analyzer 130; the mass resolving device 150; the collimator 180; and the acceleration/deceleration stage 190. It is noted that one or more of these components may not be included in the beam line ion implantation system.

Further, while the above disclosure describes a ribbon ion beam, which has a width much greater than its height, other embodiments are also possible. For example, a scanned spot beam may enter the end station 200. A scanned spot beam is an ion beam that is typically in the shape of a circle, which is scanned laterally to create the same effect as a ribbon ion beam.

A controller 195 may be used to control the system. The controller 195 has a processing unit and an associated memory device. This memory device contains the instructions, which, when executed by the processing unit, enable the system to perform the functions described herein. This memory device may be any non-transitory storage medium, including a non-volatile memory, such as a FLASH ROM, an electrically erasable ROM or other suitable devices. In other embodiments, the memory device may be a volatile memory, such as a RAM or DRAM. In certain embodiments, the controller 195 may be a general purpose computer, an embedded processor, or a specially designed microcontroller. The actual implementation of the controller 195 is not limited by this disclosure.

Figure 2:
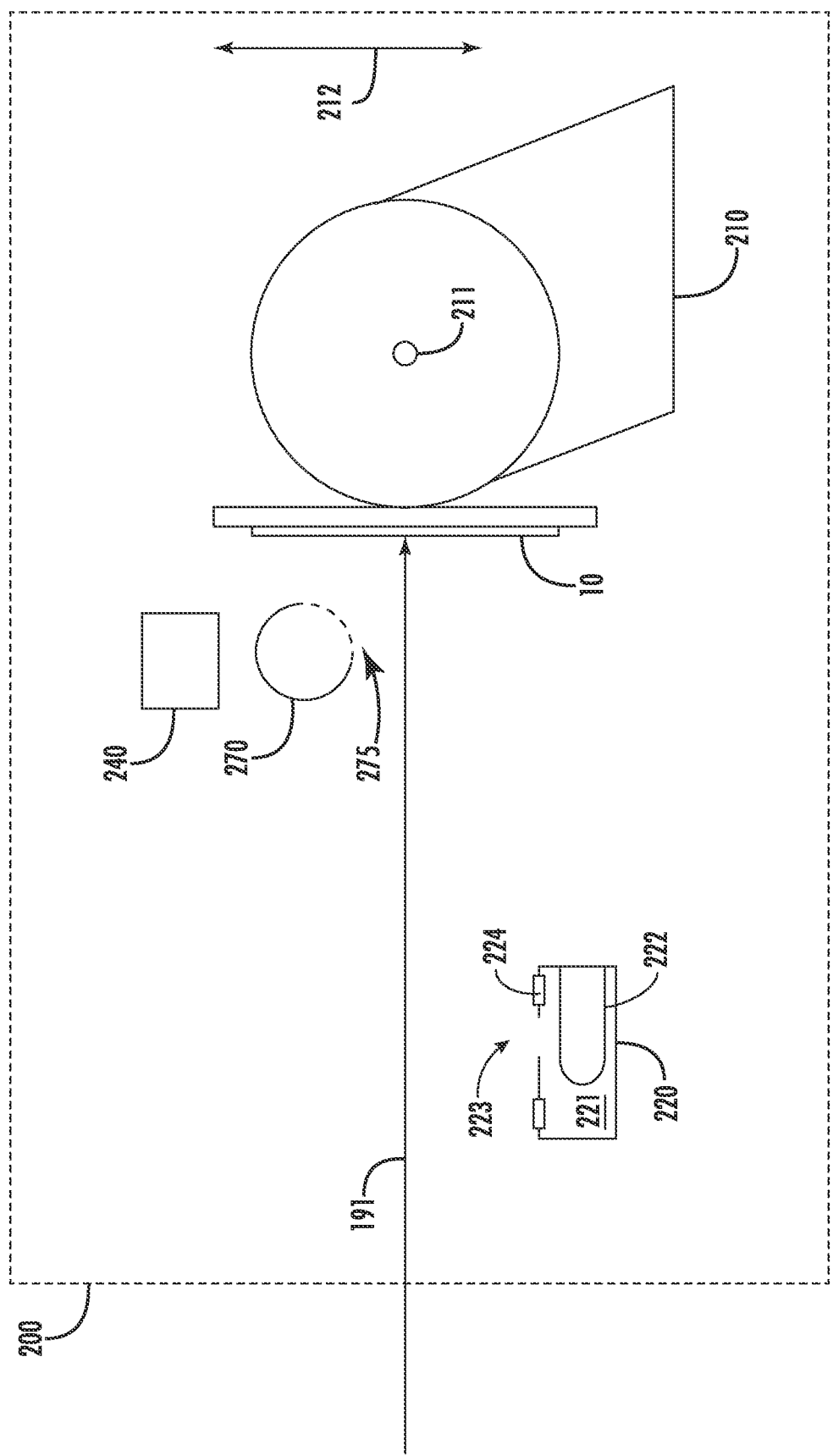
FIG. 2 shows the end station of FIG. 1 according to one embodiment.

FIG. 2 shows an end station 200 according to one embodiment. As described above, the workpiece 10 is disposed in the end station 200. The ion beam 191 enters the end station 200 and is directed toward the workpiece 10. The workpiece 10 may be held by a platen 210. The platen 210 may be capable of rotation about an axis perpendicular to the front surface of the platen 210. The platen 210 may also be capable of rotation about an axis 211 parallel to the front surface of the platen 210. Additionally, the platen 210 may be capable of linear motion along direction 212. Of course, the platen 210 may also have less than all of these capabilities.

Disposed in the end station 200 and proximate the ion beam 191 may be a plasma flood gun 220. A plasma flood gun 220 is used to emit low energy electrons to reduce space charge blowup and to neutralize the workpiece 10. Of particular note, the plasma flood gun 220 is only used to emit a net negatively charged flux in the form of electrons from a plasma formed of a rare or non-reactive gas, and not other plasma species such as atomic or molecular radicals from molecular dissociation. In other words, the plasma flood gun 220 uses an inert gas, such as xenon to emit electrons. The plasma flood gun 220 is not intended to change the properties of the workpiece 10.

In one embodiment, the plasma flood gun 220 may comprise a plasma chamber 221 that has a substantially metal-free inner surface. A radio-frequency coil 222 may be disposed within the plasma chamber 221 for directly exciting a gas enclosed in the chamber, thus creating and maintaining a desired plasma. The plasma chamber 221 may have, on one side, an elongated exit aperture 223 through which the plasma can flow out of the plasma chamber 221 and into engagement with the ions of ion beam 191. A series of magnets 224 may be disposed about the plasma chamber 221 to contain and control the plasma created therein. In particular, the magnets 224 may be positioned outside the walls of the plasma chamber 221 and their respective magnetic fields extend through the wall of the plasma chamber 221.

More specifically, the interior portions of the plasma chamber 221 may be made out of a non-metallic conductive material such as graphite or silicon carbide (SiC). A feedthrough gas pipe may be provided in a sidewall of the plasma chamber 221 through which one or more gaseous substances may be supplied to the plasma chamber 221. The gaseous substances may include inert gases such as xenon (Xe), argon (Ar) or Krypton (Kr). The gas pressure is typically maintained in a range of 1-50 mTorr.

The radio-frequency coil 222 may have an elongated shape that extends generally through the center of the plasma chamber 221. One end of the radio-frequency coil 222 may be connected to an RF power supply, which may inductively couple RF electrical power in the plasma chamber 221. The RF electrical power may operate at typical frequencies, such as, for example, 2 MHz, 13.56 MHz and 27.12 MHz. The radio-frequency coil 222 may be completely enclosed within the plasma chamber 221. In a sidewall of the plasma chamber, the exit aperture 223 is positioned to allow the generated plasma to flow into contact with the ion beam 191. For a ribbon-shaped ion beam, the exit aperture 223 may cover substantially the ribbon width.

According to one embodiment, it may be desirable for the plasma from the plasma flood gun 220 to form a plasma bridge with an ion beam 191 passing just outside the plasma chamber 221. As previously noted, the plasma chamber 221 may include a series of magnets 224, such as either permanent magnets or electromagnets, arranged to contain and control the plasma created within the plasma chamber 221. The characteristics of these magnets 224 can also be arranged to control the characteristics of the plasma as it exits the plasma chamber 221 through the exit aperture 223.

In other embodiments, the plasma flood gun 220 may be a Bernas type ion source, where a filament is used to produce thermoionic emission. A gas, such as argon is introduced into the plasma chamber. The emitted electrons are used to excite a plasma within the plasma chamber. The electrons from the plasma are then extracted from the plasma chamber through the exit aperture.

In other words, the plasma flood gun 220 may be constructed in various ways and its implementation is not limited by this disclosure.

Thus, the electrons from the plasma flood gun 220 may be confined by a magnetic field to direct their path toward the ion beam 191. In certain embodiments, a plasma flood gun 220 may not be used.

An auxiliary plasma source 270 is disposed within the end station 200. Unlike the plasma flood gun 220, the auxiliary plasma source 270 is used to emit ions and/or radicals into the area proximate the workpiece 10 through one or more exit apertures 275. As is well known, a radical is a molecular or atomic species that has an unpaired valence electron. Consequently, radicals are typically highly reactive. Radicals are typically created by the disassociation of larger molecules in the auxiliary plasma source 270. In certain embodiments, the auxiliary plasma source 270 is disposed within 30 cm of the workpiece 10, although other embodiments are also possible. While the auxiliary plasma source 270 is illustrated as being cylindrical, it is understood that this is merely illustrative, and the auxiliary plasma source 270 may be any shape.

In certain embodiments, a heater 240 may also be disposed in the end station 200. The heater 240 may be located near the auxiliary plasma source 270, such that both heater 240 and auxiliary plasma source 270 are disposed on the same side of the ion beam 191. The heater 240 may be any suitable device, including heat lamps, LEDs, or resistive heaters. While FIG. 2 shows the auxiliary plasma source 270 disposed between the ion beam 191 and the heater 240, other configurations are also possible. For example, the heater 240 may be disposed between the ion beam 191 and the auxiliary plasma source 270. In another embodiment, the heater 240 and the auxiliary plasma source 270 may be disposed on opposite sides of the ion beam 191.

Figure 3A:
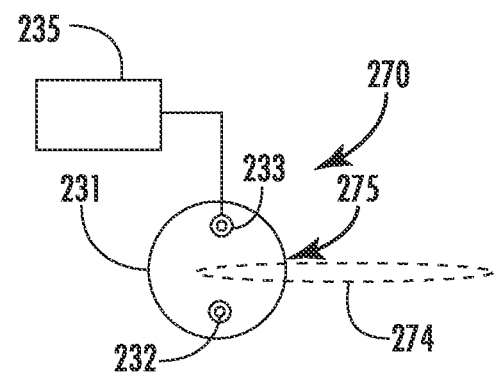
FIG. 3A shows the auxiliary plasma source of FIG. 2 according to one embodiment.

In one embodiment, shown in FIG. 3A, the auxiliary plasma source 270 comprises an outer housing 231, which may be cylindrical, although other shapes are also possible. The outer housing 231 may be constructed of aluminum or some other suitable material. Within the outer housing 231 is an antenna 232, which may be surrounded by a protective cover 233. The antenna 232 may be constructed of a conductive material, such as a metal and may be U-shaped. The antenna 232 is coated with, or coaxial within, a protective cover 233, which may be a ceramic material to protect the antenna 232 from the plasma 274 generated within the auxiliary plasma source 270. The outer housing 231 includes one or more exit apertures 275, through which the plasma 274 exits the auxiliary plasma source 270 and enters the end station 200. In operation, a process gas is introduced into the volume defined by the outer housing 231. The antenna 232 is energized using an RF power source 235. This energy creates a plasma 274 within the auxiliary plasma source 270. The plasma 274 then exits the auxiliary plasma source 270 via one or more exit apertures 275.

Figure 3B:
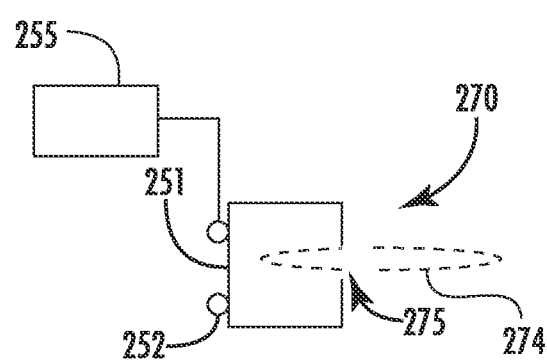
FIG. 3B shows the auxiliary plasma source of FIG. 2 according to another embodiment.

FIG. 3B shows the auxiliary plasma source 270 according to another embodiment. In this embodiment, the auxiliary plasma source 270 has the antenna 252 disposed outside the outer housing 251. The antenna 252 is energized using an RF power source 255. For example, the wall proximate to the antenna 252 may be a dielectric material so that energy from the antenna 252 passes through the wall and into the volume defined by the outer housing 251. A process gas is introduced into this volume and when energized, creates a plasma 274. The plasma 274 then exits the auxiliary plasma source 270 via one or more exit apertures 275.

Other types of devices may be used for the auxiliary plasma source 270. For example, an indirectly heated cathode (IHC) ion source may be used. Alternatively, a Bernas source may be used. In another embodiment, an inductively coupled plasma (ICP) or capacitively coupled plasma (CCP) source may be used. Thus, the auxiliary plasma source 270 is not limited to those shown in FIGS. 3A-3B.

Figure 4A:
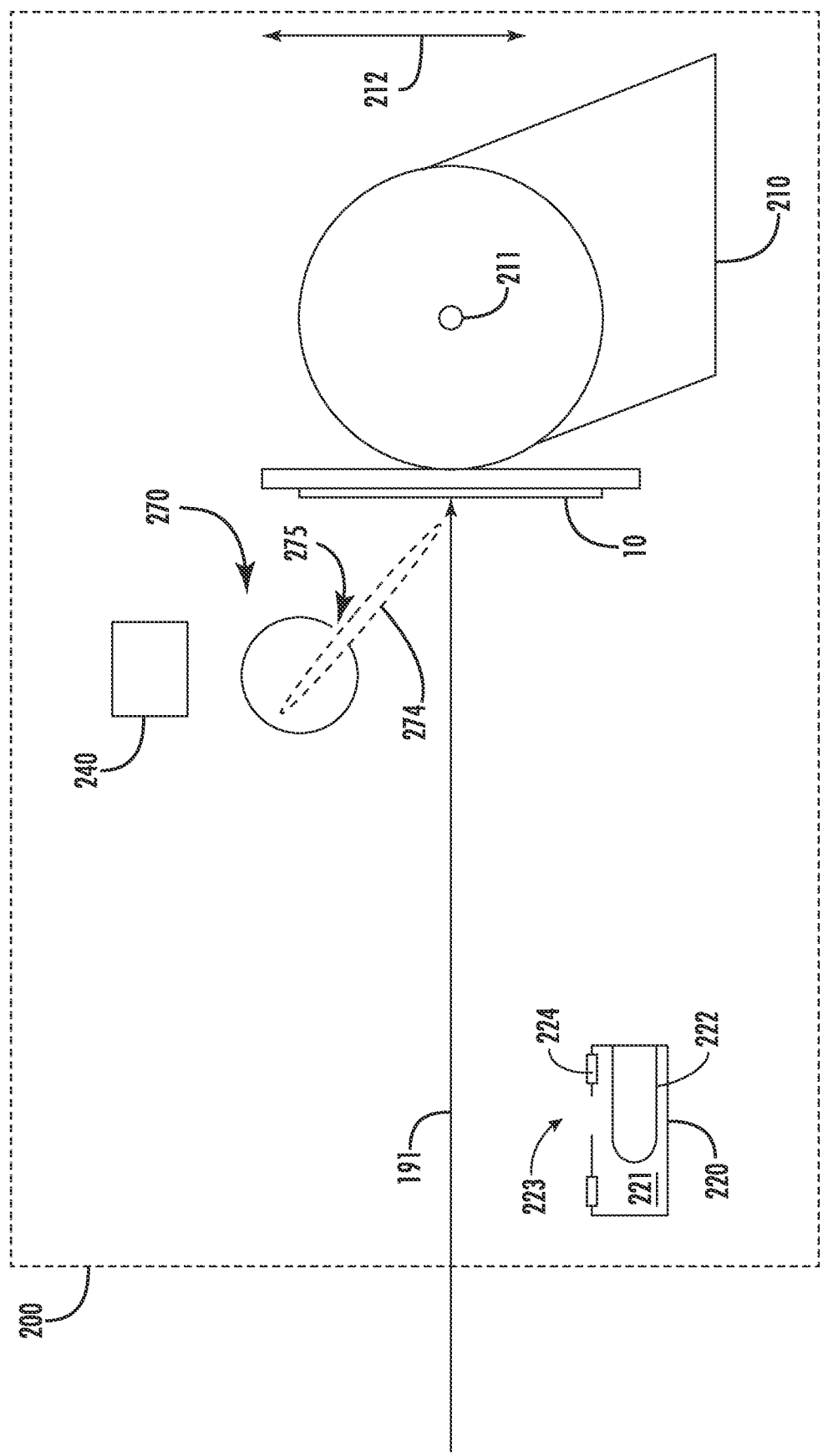
FIG. 4A shows the configuration of the end station of FIG. 2 according to one embodiment.

In certain embodiments, such as that shown in FIG. 4A, the auxiliary plasma source 270 may be oriented such that the one or more exit apertures 275 emit the plasma 274 toward the workpiece 10 at the location where the ion beam 191 strikes the workpiece 10. In this way, the ion beam 191 cooperates with the plasma 274 to process the workpiece 10. For example, the ions and radicals in the plasma 274 may deposit on the workpiece 10 in the area that is being exposed to the ion beam 191. As described with respect to FIG. 2, the end station 200 may include a plasma flood gun 220 and/or a heater 240, if desired.

Figure 4B:
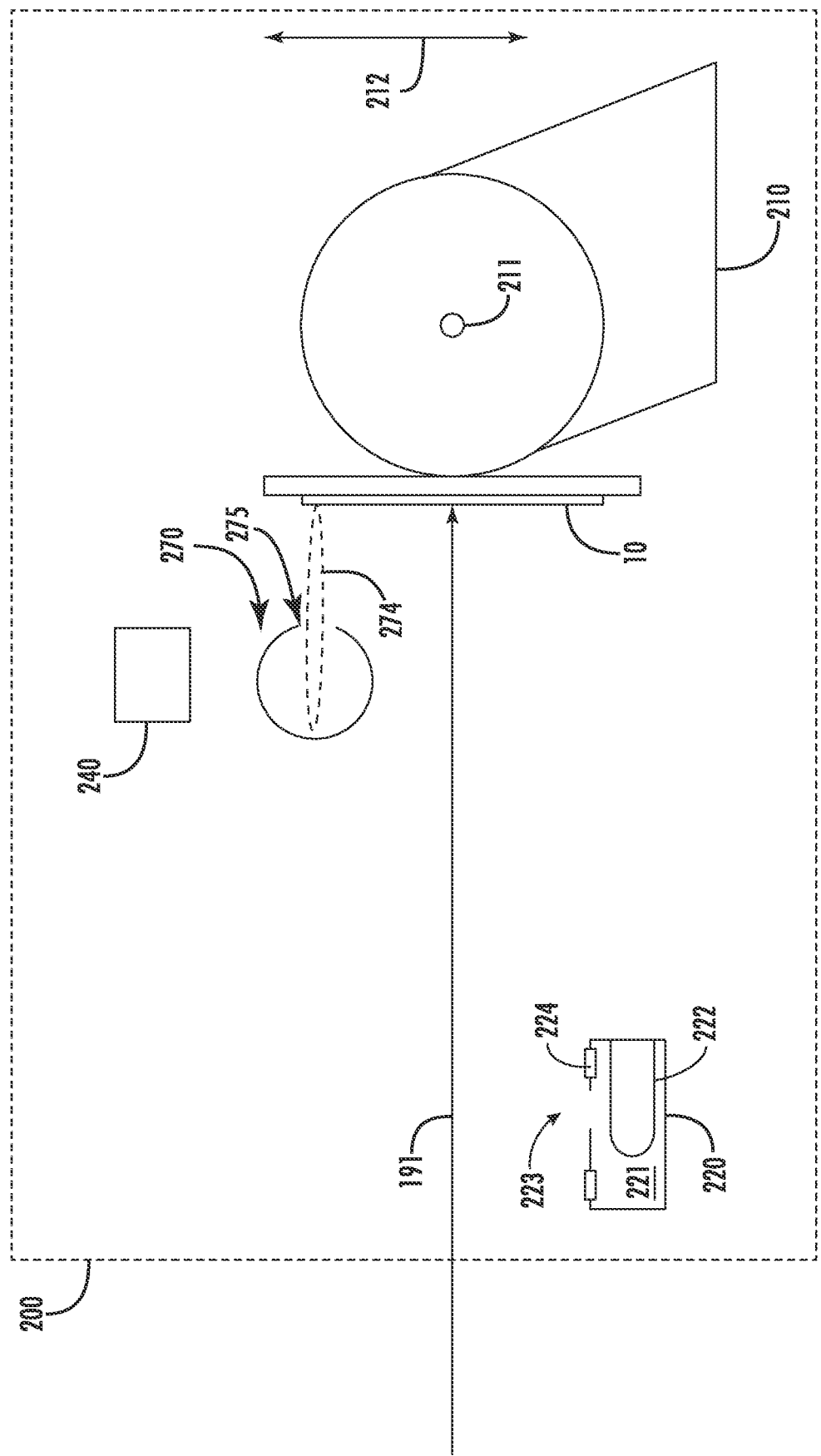
FIG. 4B shows the configuration of the end station of FIG. 2 according to another embodiment.

FIG. 4B shows the end station 200 according to another embodiment. In this embodiment, the auxiliary plasma source 270 is oriented such that the one or more exit apertures 275 are directly facing the workpiece 10. In this way, the flow of plasma 274 is parallel to the ion beam 191. As described with respect to FIG. 2, the end station 200 may include a plasma flood gun 220 and/or a heater 240, if desired In the embodiments shown in FIGS. 4A-4B, a process gas may be introduced into the auxiliary plasma source 270. The antenna is energized, such as through the use of a RF power supply. The energy in the antenna causes the process gas within the auxiliary plasma source 270 to ionize and form a plasma 274. This plasma 274 then exits through the one or more exit apertures 275 toward the workpiece 10. In certain embodiments, a voltage difference may exist between the auxiliary plasma source 270 and the workpiece 10. For example, the auxiliary plasma source 270 may be biased more positively than the workpiece 10. In some embodiments, the auxiliary plasma source 270 may be biased 0-5000V more positive than the workpiece 10. In certain embodiments, the auxiliary plasma source 270 may be biased between 0-500V more positive than the workpiece 10. In this embodiment, positive ions within the auxiliary plasma source 270 are accelerated toward the workpiece 10. Alternatively, the auxiliary plasma source 270 may be biased more negatively than the workpiece 10. In this embodiment, positive ions within the auxiliary plasma source 270 are somewhat repelled by the workpiece 10. In other embodiments, the auxiliary plasma source 270 may be at the same potential as the workpiece 10 so that the ion and radical flux from the auxiliary plasma source 270 simply drifts through the one or more exit apertures 275.

In the embodiment shown in FIG. 4A, as the platen 210 moves upward along direction 212, a portion of the workpiece 10 is exposed to the ion beam 191 and the plasma 274 from the auxiliary plasma source 270. After this exposure, that portion of the workpiece 10 may next be heated by the heater 240.

In the embodiment shown in FIG. 4B, the workpiece 10 is first processed by the ion beam 191 and then by the plasma 274 when moving upward. After being exposed to the ion beam 191 and the plasma 274, the workpiece 10 may then be subjected to a thermal process by the heater 240.

The use of heat following a treatment by the ion beam 191 and/or the plasma 274 may have beneficial applications.

It is noted that any type of auxiliary plasma source may be employed in the configurations shown in FIGS. 4A-4B. Thus, the choice of type of auxiliary plasma source 270 and its orientation are design decisions based on the process being performed and other considerations.

The flow rate of the process gas into the auxiliary plasma source 270 as well as the energy applied by the antenna are factors in determining the number of radicals and ions that are extracted from the auxiliary plasma source 270. In certain embodiments, the process gas is diluted with an inert gas to maintain the plasma or to reduce the number of radicals and ions of the desired species for process control.

While FIG. 1 is described in connection with ion implantation, it is understood the end station 200 can be utilized with any semiconductor processing system. Having described a semiconductor processing system with a source engineering source, various applications of this semiconductor processing system will be described.

In one embodiment, the semiconductor processing system of FIG. 1, using the configuration shown in FIG. 4A, may be used to perform an ion implantation process. As described above, the end station of FIG. 4A directs the plasma 274 from the auxiliary plasma source 270 toward the workpiece 10 at the location where the ion beam 191 impacts the workpiece 10. In this way, there is interaction between the ion beam 191 and the plasma 274 simultaneous with the surface of workpiece 10.

In this embodiment, a target species is desired to be implanted into the workpiece 10. For example, the target species may be a Group III element, a Group IV element, or a Group V element. For example, in one embodiment, arsenic may be the desired species. The desired species is introduced into the auxiliary plasma source 270. The desired species may be introduced in the form of a molecule containing the target species. This desired species is energized to form a plasma 274. As shown in FIG. 5, the plasma 274 diffuses toward the workpiece 10 near the location where the ion beam 191 impacts the workpiece 10. Ions and radicals from the plasma 274 may become disposed on the surface of the workpiece 10, such as in the form of a film 277. A gas, such as argon, xenon or krypton, is introduced into the ion source 100 (see FIG. 1) and used to create the ion beam 191. In certain embodiments, the gas may be an inert species, defined as a Group VIII element, such as neon, argon, xenon, or krypton. The ion beam 191 collides with the ions and radicals from the plasma 274 that are proximate to or have been deposited as a film 277 on the workpiece 10. These collisions transfer much of the energy from the ions in the ion beam 191 to the ions and radicals from the plasma 274. This causes the ions and radicals from the plasma 274 to acquire the velocity needed to penetrate the surface of the workpiece 10. Thus, the energy of the ions in the ion beam 191 is imparted to the ions and radicals from the plasma 274. This allows the ions and radicals in film 277 to be driven into the workpiece 10. In this embodiment, the ion beam 191 is used to knock in ions and radicals from the plasma 274. Thus, unlike conventional ion implanters, the ions in the ion source 100 are used to provide energy to drive in the ions and radicals that are generated in the auxiliary plasma source 270 in the end station 200.

Thus, in this embodiment, the ion beam 191 is used to provide the energy, while the auxiliary plasma source 270 is used to supply the desired species. While the above description uses inert gasses and arsenic, these are purely illustrative and the disclosure is not limited to this embodiment. The ion beam 191 may be made from any species of ions. In some embodiments, certain species, such as inert elements or Group IV elements, may be used so that the ion beam does not affect the conductivity of a silicon wafer. The target species may be any desired species, including Group III elements, such as boron and gallium, and Group V elements, such as phosphorus and arsenic. In certain embodiments, the Group III elements and Group V elements may be combined with other elements to form molecules, such as $BF_3$, $AsH_3$, $PH_3$, and others.

In another embodiment, the semiconductor processing systems described herein may be used for an etching process. Specifically, the use of an auxiliary plasma source 270 may allow the creation of more chemically active radicals proximate the workpiece. In this case, the auxiliary plasma source 270 is used to create ions, radicals, and metastable neutrals of an etching chemistry, such as Group VII elements and molecules containing these elements. These ions and metastable neutrals exit the auxiliary plasma source 270 and drift toward the workpiece 10. Because the ions from the auxiliary plasma source 270 have low energy, these ions deposit at or near the surface of the workpiece 10.

In one particular embodiment, a halogen containing gas is introduced into the auxiliary plasma source 270 to generate ions. The low energy ions and radicals that exit the auxiliary plasma source 270 may form a thin film on the surface of the workpiece 10. This thin film reacts with the workpiece 10 to etch it with energy provided by the ion beam 191. In certain embodiments, the ion beam 191 may comprise an inert gas, such as argon. In one embodiment, the embodiment of FIG. 4A is used such that the ion beam 191 is directed toward the portion of the workpiece 10 while the film is being formed. In another embodiment, the embodiment of FIG. 4B is used such that the ion beam 191 is directed toward the portion of the workpiece 10 after the film has been formed.

In another particular embodiment, $CF_4$ and oxygen are ionized and dissociated in the auxiliary plasma source 270. An ion beam 191 comprised of an inert gas, such as argon, is used to etch the surface of the workpiece 10.

In yet another particular embodiment, a native oxide layer may form on the surface of the workpiece 10. This native oxide layer may be etched by ionizing hydrogen in the auxiliary plasma source 270. An ion beam comprised of an inert gas, such as argon, is used to etch the native oxide from the surface of the workpiece 10.

In another embodiment, the semiconductor processing system of FIGS. 1-4 may be used for deposition. The material to be deposited may be ionized in the auxiliary plasma source 270. The material may be a dopant or may be a material that is used as a coating for the workpiece 10. Ions and radicals from that material exit the auxiliary plasma source 270 and drift toward the workpiece 10, where they are deposited on the surface of the workpiece 10.

In one particular embodiment, the process gas may be $CH_4$, while the ion beam 191 comprises a Group IV element, such as carbon. This allows a more box-like profile in the workpiece 10. In contrast, the use of the ion beam 191 alone creates a retrograde profile.

Thus, in applications where the ion beam 191 and the auxiliary plasma source 270 are used concurrently, the ion beam 191 may be used to perform at least one of two functions.

First, the ion beam 191 may supply the energy needed to drive the ions or radicals from the auxiliary plasma source 270 toward and into the workpiece 10. One example of this is the use of the ion beam 191 to knock the ions from the plasma 274 into the workpiece 10, as shown in FIG. 5.

Second, the ion beam 191 may supply additional species to facilitate or cause chemical reactions at the surface of the workpiece 10. This may be accomplished in a number of ways. First, the ion beam 191 may weaken the bonds of the underlying workpiece 10 so that the surface of the workpiece 10 can react with deposited layer. Second, the ion beam 191 may intermix the deposited layer into the underlying workpiece 10 for more reactions. Third, the ion beam 191 may liberate or volatilize the new formed compound made from the deposited layer and the workpiece 10. The sputter yield of this newly formed compound may be much higher than the sputter yield of the ion beam 191 on the workpiece 10 alone. For example, in an etching process, $CF_4$ and oxygen radicals create a CFx polymer type material with the silicon nitride on the surface of the workpiece 10. The resulting SiFxCy compound is volatized by the energy of the ion beam 191.

In yet another embodiment, the use of the auxiliary plasma source 270 and the ion beam 191 may not be concurrent. For example, the workpiece 10 may be processed by one of these sources and then processed by the other of these sources at a later time.

Figure 6:
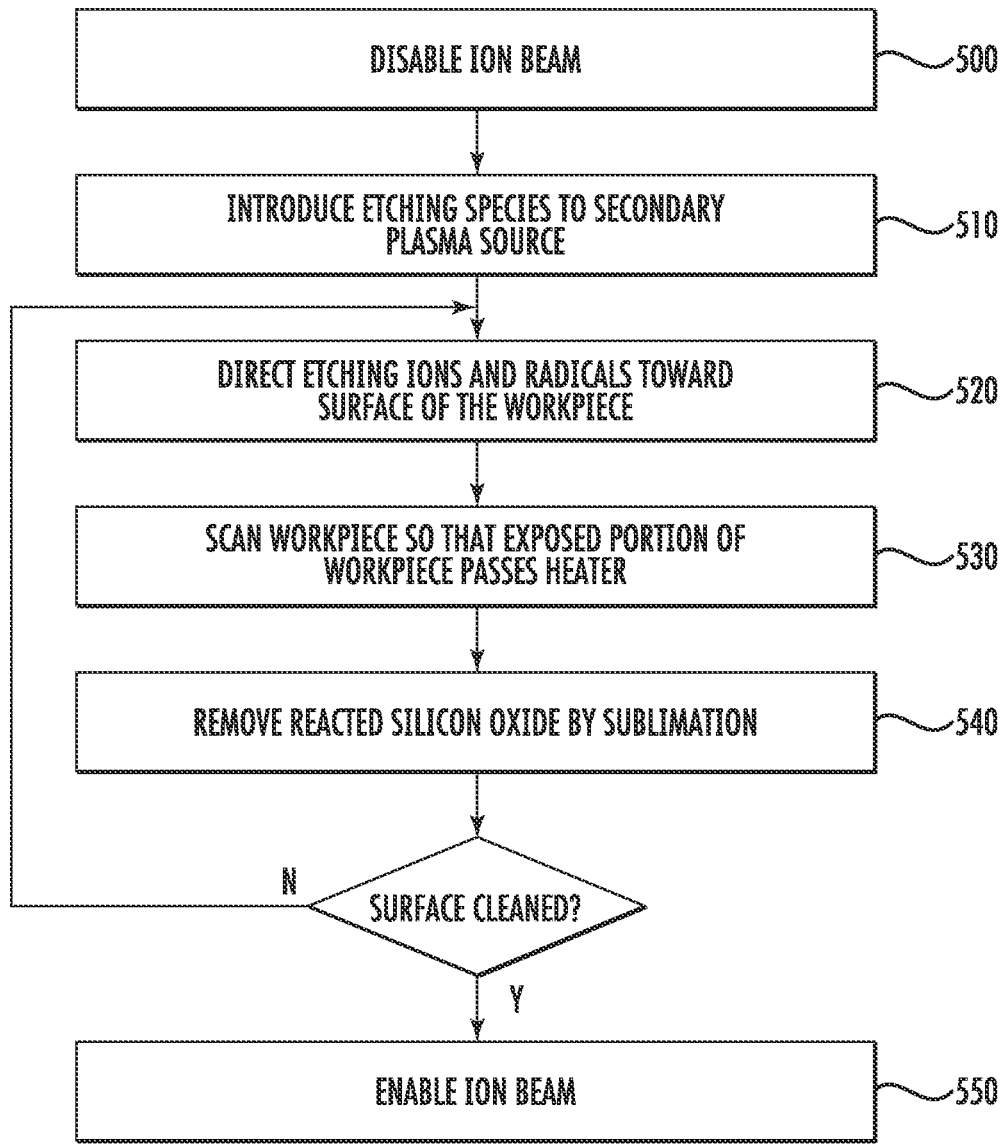
FIG. 6 shows a representative flow chart of one pretreatment process.

For example, in one embodiment, the auxiliary plasma source is used to provide a pre-treatment of the workpiece 10. A flowchart of this process is shown in FIG. 6. In this embodiment, the embodiment of FIG. 4A or FIG. 4B may be used since the ion beam 191 is not active during the pre-treatment. First, as shown in Process 500, the ion beam 191 is disabled. One or more etching species, such as ammonia ($NH_3$) and $NF_3$, are introduced into the auxiliary plasma source 270, as shown in Process 510. The auxiliary plasma source 270 creates ions and other radicals. These ions and radicals exit the auxiliary plasma source 270 and drift toward the workpiece 10, where they react with the silicon oxide layer of the workpiece 10, as shown in Process 520. The workpiece 10 is scanned so that the portion of the workpiece 10 that was exposed to the ions and radicals is then heated by the heater 240, as shown in Process 530. The heat serves to sublime the reacted silicon oxide that is created on the surface of the workpiece 10, as shown in Process 540. This process is repeated until the surface of the workpiece 10 is cleaned. After this, the workpiece 10 may be subjected to another process by the ion beam 191, as shown in Process 550. Advantageously, the workpiece 10 remains in the end station 200 for the entirety of the pre-treatment and the second process shown in Process 550. In other words, the workpiece 10 does not leave the end station between the pre-treatment and the second process.

In another embodiment, the process described above can be performed when a workpiece 10 is not disposed on the platen 210. In this embodiment, this process may serve to clean the platen 210.

Figure 7:
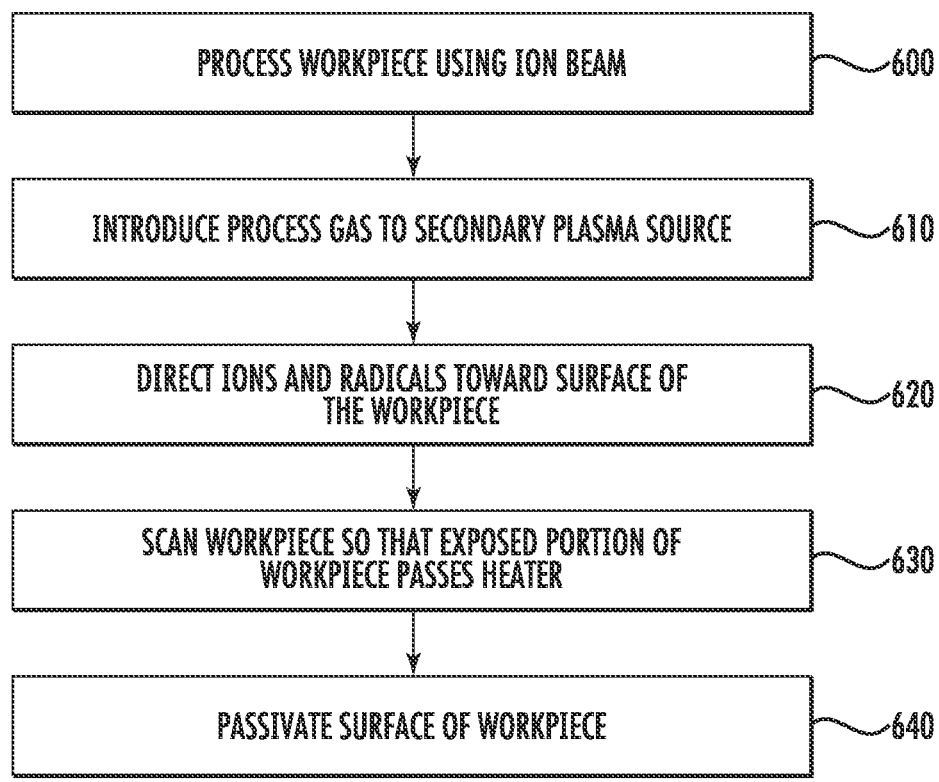
FIG. 7 shows a representative flow chart of one post-treatment process.

In another embodiment, the auxiliary plasma source 270 is used in the post-treatment of a workpiece 10. For example, a post treatment may be used to either passivate the surface of the workpiece 10 or to recover the damage caused by an ion implantation process. A flowchart of this is shown in FIG. 7. First, as described above, the workpiece 10 is processed using the ion beam 191. The process gas is then introduced into the auxiliary plasma source 270, as shown in Process 610. The process gas may comprise a hydrogen/nitrogen mixture. Ions and radicals from the auxiliary plasma source 270 are directed toward the surface of the workpiece 10, as shown in Process 620. The workpiece 10 is scanned past the heater 240, at a temperature of, for example, between 100° C.-500° C., as shown in Process 630. The damage recovery has been shown to work with forming gas at reduced temperature and is referred to as a plasma anneal. The passivation occurs from having radicals of hydrogen or nitrogen react with the dangling bonds of the surface, as shown in Process 640.

In one embodiment, the post-treatment shown in FIG. 7 is performed while the ion beam 191 is disabled. In another embodiment, the post-treatment may be performed using the embodiment shown in FIG. 4B. Specifically, the workpiece 10 implanted by ion beam 191. As the workpiece 10 is moved upward in direction 212, the implanted portion is then exposed to the process gas from the auxiliary plasma source 270. After this, that implanted portion is then heated. Thus, in this embodiment, the workpiece 10 is implanted by the ion beam 191 and post-treated during a single scan of the workpiece 10. In other words, one portion of the workpiece is exposed to the ion beam while a second portion of the workpiece, different from the first portion, is exposed to the plasma.

Thus, the present disclosure describes a semiconductor processing system where a source of ions and radicals is incorporated in the end station 200. Conventionally, great efforts are made to ensure that no ions or radicals are introduced in the end station 200. Specifically, plasma flood guns 220 are designed to insure that mostly electrons are emitted into the end station 200. The present semiconductor processing system deliberately introduces ions and radicals into the end station 200. In certain embodiments, these ions and radicals are introduced concurrently with the use of an ion beam 191 to perform applications that are not otherwise possible.

Figure 8:
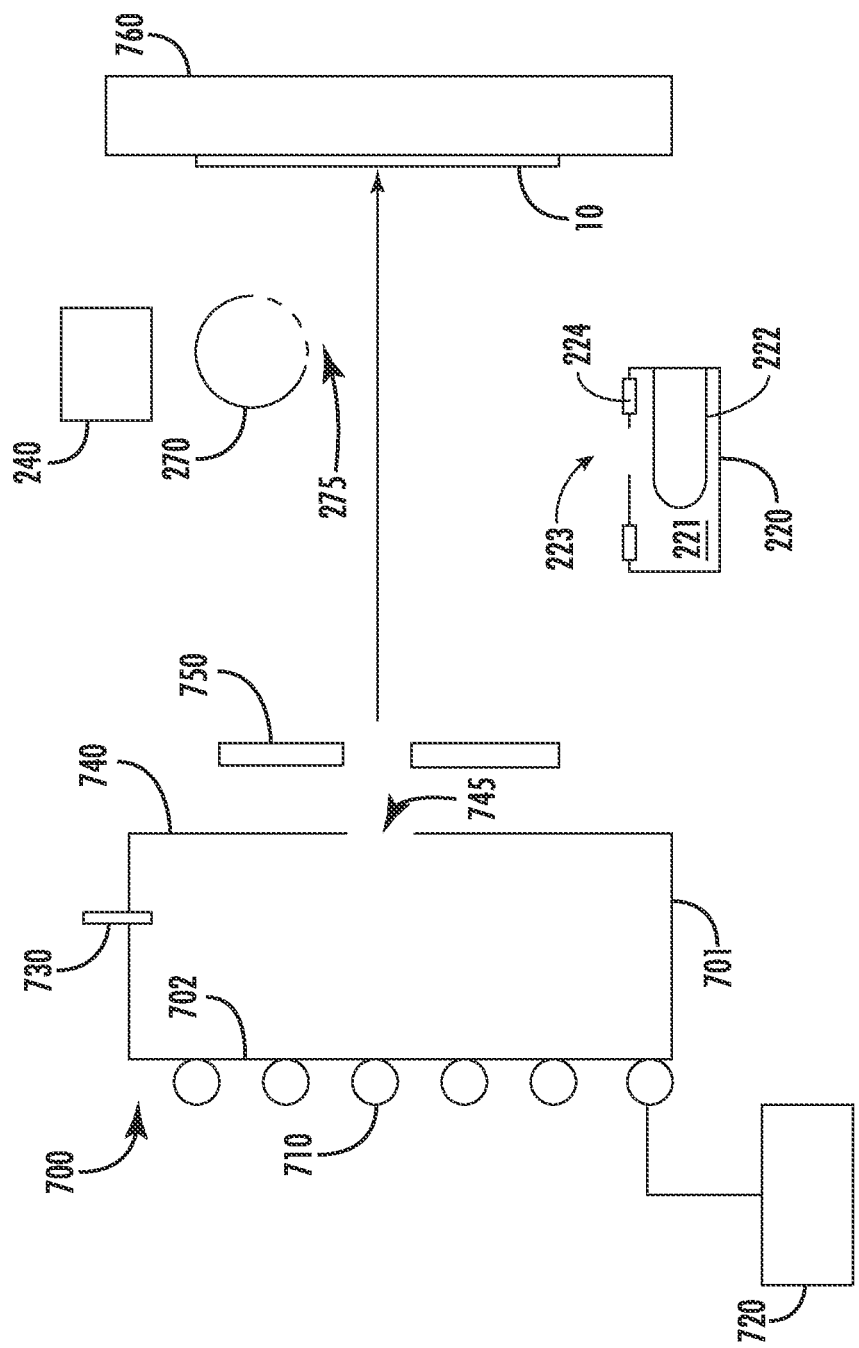
FIG. 8 shows a semiconductor processing system using the inline surface engineering source according to another embodiment.

While the above disclosure describes the use of an auxiliary plasma source 270 with a beam line ion implantation system, other embodiments are also possible. For example, FIG. 8 shows such an example. In this figure, the semiconductor processing system includes an ion source chamber 700, comprised of a plurality of chamber walls 701. In certain embodiments, one or more of these chamber walls 701 may be constructed of a dielectric material, such as quartz. An RF antenna 710 may be disposed on an exterior surface of a first dielectric wall 702. The RF antenna 710 may be powered by a RF power supply 720. The energy delivered to the RF antenna 710 is radiated within the ion source chamber 700 to ionize a feed gas, which is introduced via gas inlet 730. In other embodiments, the gas is ionized in a different manner, such as through the use of an indirectly heated cathode (IHC), a capacitively coupled plasma source, an inductively coupled plasma source, a Bernas source or any other plasma generator.

One chamber wall, referred to as the extraction plate 740, includes an extraction aperture 745 through which ions may exit the ion source chamber 700. The extraction plate 740 may be constructed of an electrically conductive material, such as titanium, tantalum or another metal. The extraction plate 740 may be in excess of 300 millimeters in width. Further, the extraction aperture 745 may be wider than the diameter of the workpiece 10. In certain embodiments, extraction optics 750, such as an electrode, may be disposed outside the extraction aperture 745 to accelerate ions generated within the ion source chamber 700 toward the workpiece 10.

The platen 760 is disposed outside the ion source chamber 700 proximate the extraction aperture 745. The workpiece 10 is disposed on the platen 760.

The auxiliary plasma source 270 may be as described with respect to FIG. 3A in certain embodiments. In other embodiments, the auxiliary plasma source 270 may be as described with respect to FIG. 3B. Further, the exit apertures 275 of the auxiliary plasma source 270 may be oriented as shown in FIG. 4A or 4B.

In certain embodiments, a plasma flood gun 220 may be utilized. The plasma flood gun 220 functions as described above.

All of the processes described herein may be performed using the configuration shown in FIG. 8.

The semiconductor processing system and method described herein have many advantages.

In the case of implantation using knock in, the depth of the implantation may be more tightly controlled. Further, when a molecule, such as $AsH_3$ is implanted, the depth of the hydrogen ions may be better controlled using knock in. There are additional benefits associated with the utilization of knock in. First, the straggle from the implanted ions may be reduced due to the deposited film absorbing energy. This is beneficial for an application such as the source/drain extension where lateral straggle may cause short channel effects under the gate. Second, the resultant dopant profile becomes surface peaked, which would create a surface peaked carrier concentration. This is beneficial for applications such as contact where the near surface is consumed by the silicide process, and low contact resistance in this region is desirable. Third, the impending ions may sputter the deposited film to adjacent fin structures improving the sidewall doping of fins.

In the case of etching, the use of an auxiliary plasma source 270 allows for the removal of a native oxide layer in the same end station as a subsequent process is performed in. An additional benefit of this configuration in etching and deposition applications is the ability to treat or create thicker films while maintaining low energy by a sequential process. Low energy may be useful so that unwanted sputtering or damage of underlying layers is prevented.

In the case of sequential operation, the use of an auxiliary plasma source 270 in the end station eliminates the need to transport the workpiece after a pre-treatment cleaning process. This also reduces the amount of time between the cleaning and the process (i.e. deposition, implantation, etching). For example, if the application is sensitive to native oxide layers, a reduction in the time between cleaning the surface of the workpiece to subjecting the workpiece to the desired process minimizes the regrowth of the native oxide layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of etching a workpiece, comprising:
creating a plasma within an auxiliary plasma source using a gas comprising an etching species, wherein the auxiliary plasma source is located proximate the workpiece, and wherein ions and radicals from the plasma exit the auxiliary plasma source toward a portion of the workpiece and form a film on the portion of the workpiece; and
using an ion beam created using an ion source, different from the auxiliary plasma source, to provide energy to etch the workpiece, wherein the auxiliary plasma source and the ion source are operated concurrently such that the ion beam is directed toward the workpiece while the auxiliary plasma source is generating the ions and radicals.

2. The method of claim 1, wherein the etching species comprises a halogen.

3. The method of claim 1, wherein the etching species comprises $CF_4$ and oxygen.

4. The method of claim 1, wherein the etching species comprises hydrogen and a native oxide layer is etched.

5. The method of claim 1, wherein the ion beam comprises an inert gas.

6. The method of claim 1, wherein the ion beam is directed to the portion of the workpiece while the film is being created.

7. The method of claim 1, wherein the ion beam is directed to the portion of the workpiece after the film has been created.

\* \* \* \* \*